US006671146B1

(12) United States Patent
Hashimoto et al.

(10) Patent No.: US 6,671,146 B1
(45) Date of Patent: Dec. 30, 2003

(54) ELECTROSTATIC PROTECTION CIRCUIT AND SEMICONDUCTOR INTEGRATED CIRCUIT USING THE SAME

(75) Inventors: Masami Hashimoto, Hine (JP); Kazuhiko Okawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/646,332
(22) PCT Filed: Jan. 19, 2000
(86) PCT No.: PCT/JP00/00215
§ 371 (c)(1),
(2), (4) Date: Dec. 19, 2000
(87) PCT Pub. No.: WO00/44049
PCT Pub. Date: Jul. 27, 2000

(30) Foreign Application Priority Data

Jan. 19, 1999 (JP) ............................................. 11-010716
Jan. 19, 1999 (JP) ............................................. 11-010717

(51) Int. Cl.[7] ............................................. H02H 9/00
(52) U.S. Cl. ............................................. 361/56; 361/111
(58) Field of Search ............................ 361/56, 111, 117, 361/118

(56) References Cited

U.S. PATENT DOCUMENTS 5,610,790 A * 3/1997 Staab et al. ................. 361/56
6,414,831 B1 * 7/2002 Orchard-Webb ............ 361/111

FOREIGN PATENT DOCUMENTS

| JP | 59-50559   | 3/1984  |
| JP | 6-335162   | 12/1994 |
| JP | 8-172188   | 7/1996  |
| JP | 10-257671  | 9/1998  |

* cited by examiner

Primary Examiner—Gregory J. Toatley, Jr.
Assistant Examiner—James A Demakis
(74) Attorney, Agent, or Firm—Oliff & Berridge PLC

(57) ABSTRACT

An electrostatic protection circuit of the present invention comprises: a first power supply terminal 1 to which a first voltage is applied; a second power supply terminal 2 to which a second voltage lower than the first voltage is applied; a first diode 12 connected in a reverse direction between the first and second power supply terminals; and a second diode 11 connected in a forward direction between the first and second power supply terminals. This configuration ensures that either one of the first and second diodes always operates in a forward direction to the static electricity applied between the first and second power supply terminals regardless of the polarity of the static electricity. Electrostatic charges therefore can be quickly absorbed through the diode in a forward direction.

11 Claims, 17 Drawing Sheets

ELECTROSTATIC PROTECTION CIRCUIT AND SEMICONDUCTOR INTEGRATED CIRCUIT USING THE SAME

TECHNICAL FIELD

The present invention relates to an electrostatic protection circuit and a semiconductor integrated circuit using the same, particularly to an electrostatic protection circuit for an integrated circuit using an insulated gate field effect transistor (hereinafter referred to as a MOSFET).

BACKGROUND ART

FIG. 9 shows a typical electrostatic protection circuit having a commonly-used signal terminal 1509 and power supply terminals 1 and 2 of a MOS integrated circuit using a bulk substrate. In FIG. 9, there are two paths for absorbing static electricity charge applied between the signal terminal 1509 and the power supply terminals 1 and 2. One is a path in which discharge current flows from the signal terminal 1509 to the first power supply terminal 1 designated as potential $+V_{DD}$ through a diode 1503 and the other is a path in which discharge current flows from the second power supply terminal 2 designated as potential $-V_{SS}$ to the signal terminal through a diode 1504. There is another path in which discharge current flows from the second power supply terminal 2 through the diode 1501 to the first power supply terminal 1. To be more practical, an input signal from a pad terminal 1506 is fed to gate electrodes of a p-type MOSFET 1507 and an n-type MOSFET 1508 which form an internal circuit inverter, through a resistor 1505 and the connection of the terminals of the diodes 1503 and 1504, as shown in FIG. 9.

If the pad 1506 is directly connected to the gate of the p-type MOSFET 1507 or n-type MOSFET 1508 of the internal circuit in FIG. 9, the gate electrodes of the p-type MOSFET 1507 and the n-type MOSFET 1508 are often broken when static electricity is applied from the pad 1506. To prevent this, a resistor 1505 for buffering the shock of static electricity and the diodes 1503 and 1504 for absorbing the charge are used. In addition, the diode 1501 serves as a charge-absorbing path not only for static electricity applied between the first and second power supply terminals but also for static electricity applied to the above-described signal terminals as discussed later.

In the conventional electrostatic protection circuit, the above-mentioned diode element 1503 for absorbing charges is connected so as to conduct the charges to the first power supply terminal 1, and the diode element 1504 is connected so as to conduct the charges from the second power supply terminal 2 to the signal terminal 1509. Further, the diode 1501 is connected in a reverse direction between the first power supply terminal 1 and the second power supply terminal 2. This is because, if the diodes 1501, 1503, and 1504 are connected in a forward direction so as to conduct the current in the opposite direction to that shown in FIG. 9, leakage currents may flow through the forward-biased diodes when the integrated circuit is connected to a power supply.

Further, in integrated circuits using a silicon-on-insulator substrate (hereinafter abbreviated as "SOI integrated circuit"), there are no wells such as those in a bulk substrate, the bottom is insulated by a buried oxide film, and the side is also covered with a local oxide film formed by LOCOS (local oxidation of silicon) method. For this reason, there is generally no equivalent to the diode 1501 between the first and second power supply terminals shown in FIG. 9. In other words, there is no diode formed by a p well and an n well in a conventional substrate between the first and second power supply terminals as shown in FIG. 11. However, such a diode is required from the viewpoint of electrostatic protection as discussed later. Therefore, in an SOI integrated circuit, a diode 1801 is added between the first and second power supply terminals as shown in FIG. 12, or a MOSFET 1901 with the source and gate electrodes connected together is connected between the first and second power supply terminals for causing the MOSFET 1901 to perform the function of the reverse-biased diode as shown in FIG. 13. Alternatively, a p-type MOSFET 2001 and n-type MOSFET 2000 each having the source and gate electrodes connected together are connected in parallel between the first and second power supply terminals as shown in FIG. 14 to cause them perform the function of the reverse-biased diodes. SOI integrated circuits are thus provided with electrostatic protection based on the same principle as for bulk-substrate integrated circuits.

If static electricity is added between the power supply terminals or between the signal terminal and one of the power supply terminals, electrostatic breakdown may occur inside the integrated circuit. In the case where static electricity is added to signal terminals, the internal circuit to which the signal terminals are connected may frequently be damaged unless the charges are quickly absorbed by an electrostatic protection circuit. In FIG. 9, the gates of p-type MOSFET 1507 and n-type MOSFET 1508 may be broken down. The gate insulating film of a MOSFET is made of a very thin film from several hundred angstrom to several tens angstrom formed between the substrate and the gate electrode, and the substrate or the source electrode is finally connected to the power supply. As a result, a high voltage is applied across the thin gate silicon oxide film to produce a strong electric field, resulting in breakdown of the gate film. Therefore, when static electricity is added, the electrostatic protection circuit in FIG. 9 or a similar means is used to absorb the charges quickly. In the circuit of FIG. 9, the following four cases are possible for the flow of charges between the signal terminal 1509 and the first and second power supply terminals 1 and 2:

(A) Signal terminal: positive charges, First power supply terminal: negative charges (B) Signal terminal: negative charges, First power supply terminal: positive charges (C) Signal terminal: positive charges, Second power supply terminal: negative charges (D) Signal terminal: negative charges, Second power supply terminal: positive charges In the conventional circuit shown in FIG. 9, the diode 1503 or diode 1504 operates in a forward direction in the cases (A) and (D) above. Accordingly, electrostatic charges that comes in can be quickly absorbed, thereby preventing electrostatic destruction. In cases (B) and (C), the diodes 1503 and 1504 are both in a reverse direction with respect to the polarity of electrostatic charges. In case (B), negative charge forces its path through the diode 1503 in a reverse direction. Otherwise, the negative charges first flow through the diode 1504 in a forward direction, then flow from the second power supply terminal 2 to the first power supply terminal 1 through the reverse diode 1501 in the substrate. In case (C), positive charges force its path through the diode 1504 in a reverse direction. Alternatively, the positive charges first flow through the diode 1503 in a forward direction, then flow from the first power supply terminal 1 to the second power supply terminal 2 through the reverse diode 1501 in the substrate. Therefore, in cases (B) and (C), because charges must necessarily flow through a diode in a reverse direction, the circuit is vulnerable to static electricity and can be broken by even comparatively low voltages. A path through which electrostatic charges flow out in the case (C) is shown in FIG. 10 as an example.

The function of the reverse-biased diode between the power supplies in the case where static electricity is applied to the signal terminals has been described above. If static electricity is applied between the power supply terminals in the same polarity as the power supply voltage, the charges flow through the diode between the power supply terminals in a reverse direction. Since even this diode does not exist in SOI integrated circuits, electrostatic charges cannot be absorbed, and hence breakdown easily occurs at the most vulnerable part among the parts involved in the power supply lines.

Next, the mechanism why a diode is endurable in a forward direction and weak in a reverse direction will be briefly discussed referring to FIGS. 30 and 31. In FIG. 30, a p-type diffusion layer 131 and an n-type diffusion layer 132 join together at the boundary to form a pn diode. FIG. 30 shows the case in which the p-type diffusion layer 131 is at a positive potential and the n-type diffusion layer 132 is at a negative potential. In this case, since the diode is forward-biased and a current therefore can flow easily everywhere in the pn boundary, the current flows uniformly across the entire pn boundary. Accordingly, the diode as a whole allows easy flow of current and exhibits high charge-absorbing capability. Furthermore, because the current flows in the diode itself well dispersed and uniformly without extreme concentration, no destruction of the diode itself occurs due to flow of current.

On the other hand, FIG. 31 shows the state where a current flows in a reverse direction. In FIG. 31, a p-type diffusion layer 141 and an n-type diffusion layer 142 join together at the boundary to form a pn diode. FIG. 31 shows the case in which the p-type diffusion layer 141 is at a negative potential and the n-type diffusion layer 142 is at a positive potential.

In this case, since the diode is reverse-biased to the voltage applied, normally no current flows. However, if a high voltage is applied to the diode in order to force a current in a reverse direction, the current begins to flow at specific parts where the breakdown voltage is comparatively low and hence current can easily flow due to non-uniform pn boundaries. Therefore, even if the voltage goes over the breakdown voltage and a current begins to flow, this does not mean that the current is flowing uniformly across the entire boundary. The current tends to concentrate in the parts allowing easy flow thereof. The state of this current flow is shown in FIG. 31. Since current does not flow uniformly in the diode but tends to concentrate in specific parts when the current flows in a reverse direction in the diode, the capability of the diode to allow current to flow is small relative to the size of the pn boundary area of the diode. In other words, the diode exhibits only a small charge absorbing capability. In addition, since current concentrates in parts of the diode allowing easy flow of current, the current density in those parts extremely increases, there is a high risk for the diode to be unduly heated and broken down.

As described above, a diode exhibits high endurance to static electricity when acting in a forward direction, but exhibits so weak endurance when acting in a reverse direction that the diode may be damaged even by low static electricity depending on the manner in which the static electricity is applied.

In the conventional electrostatic protection circuit configuration, the above-described occurrence in which the diodes operate only in a reverse direction to the charges is unavoidable. To improve the electrostatic endurance in these cases, conventionally the size of the diode or MOSFET has been increased to cope with weakness in a reverse direction by increasing the areas of the diode or MOSFET. This increases the area occupied by the electrostatic protection circuit attached to each pad, resulting in a cost increase and limitation to the number of pads and pins which can be formed.

Furthermore, the increase in the diode area accompanies an increase in the parasitic electrostatic capacity acting as a capacitor, causing degradation of the high frequency characteristics of signal terminals for which the high frequency operation is required and an increase in power consumption.

In the case of SOI integrated circuits, as mentioned above there is a problem of very low electrostatic endurance due to absence of even the reverse-biased diode formed by p and n wells between the power supply terminals. Assume that an attempt is made, for example, to add a reverse-biased diode or equivalent device corresponding to the reverse-biased diode formed by p and n wells in a conventional bulk substrates between the power supply terminals by forming an additional diode or MOSFET. This method also cannot provide SOI integrated circuits with a sufficiently high electrostatic endurance because it is not possible to form a reverse-biased diode as large as the conventional reverse-biased diode formed by the p and n wells parasiting between power supply terminals with a very large area because of the limitation to the area.

The present invention has been completed in view of these problems, and has an objective of providing an improved electrostatic protection circuit which affords a sufficiently high electrostatic endurance between the power supply terminals or between one of the power supply terminals and the signal terminal, and a semiconductor integrated circuit using the electrostatic protection circuit. Another objective of the present invention is to provide an electrostatic protection circuit exhibiting high electrostatic endurance with a comparatively small area, and a semiconductor integrated circuit using this electrostatic protection circuit, which is sufficiently endurable to the static electricity and suitable for high-frequency operation because of very small parasitic electrostatic capacity due to the use of this protection circuit.

DISCLOSURE OF THE INVENTION

According to one aspect of the present invention, there is provided an electrostatic protection circuit comprising:

a first power supply terminal to which a first voltage is applied;

a second power supply terminal to which a second voltage lower than the first voltage is applied;

a first diode connected in a reverse direction between the first and second power supply terminals; and a second diode connected in a forward direction between the first and second power supply terminals, wherein a forward drop voltage of the second diode is set to be higher than a drive voltage supplied between the first and second power supply terminals.

According to this aspect of the present invention, either one of the first and second diodes always operates in a forward direction with respect to the static electricity applied between the first and second power supply terminals regardless of the polarity of the static electricity. Electrostatic charges therefore can be quickly absorbed through the diode in a forward direction.

Because the second diode is connected in a forward direction between the first and second power supply terminals in this embodiment, this second diode is forward-biased to the electric charges of the drive voltage applied between the first and second power supply terminals in the ordinary operations. However, the forward drop voltage of the second diode is set to be higher than the drive voltage supplied between the first and second power supply terminals. For this reason, a forward leakage current does not flow through the second diode during normal operation.

The second diode may have a pn junction structure formed by a p-type diffusion layer and an n-type diffusion layer joined together. In this case, the forward drop voltage of the second diode is defined by a contact potential (or contact potential difference) which is a potential difference generated at the boundary of the p-type diffusion layer and an n-type diffusion layer. Therefore, if the forward drop voltage of the second voltage is set to be higher than the drive voltage supplied between the first and second power supply terminals, a forward leakage current of the second diode can be prevented from flowing during normal operation.

The second diode may be formed from a plurality of diodes connected in series. Each of the plurality of diodes has a pn junction structure formed by a p-type diffusion layer and an n-type diffusion layer joined together. Assuming that the number of diodes connected in series is n, the forward drop voltage of the second diode becomes n times the contact potential of each diode. As a result, it is possible to use higher power supply voltages.

The second diode may include first p-type and n-type diffusion layers and a second p-type or n-type diffusion layer disposed between and connected to the first p-type and n-type diffusion layers. In this case, it is preferable that the diffusion concentration of the first p-type and n-type diffusion layers is set to be higher than the diffusion concentration of the second p-type or n-type diffusion layer. Because the contact potential of the second diode can be increased in this manner, it is possible to use higher power supply voltages.

The second diode may also be formed by a MOS transistor having a drain electrode and a gate electrode which are connected to each other. In this case, the forward drop voltage of the second diode is defined by the threshold voltage of the MOS transistor.

The second diode may also be formed by connecting a plurality of MOS transistors in series. In this case, a drain electrode and a gate electrode are connected to each other in each of the plurality of MOS transistors. Assuming the number of MOS transistors connected in series is n, the forward drop voltage of the second diode is n times the threshold voltage of each MOS transistor. As a result, it becomes possible to use higher power supply voltages.

The first diode may be formed by connecting in parallel a p-type MOS transistor having a source electrode and a gate electrode connected to the first power supply terminal, with an n-type MOS transistor having a source electrode and a gate electrode connected to the second power supply terminal. This configuration ensures the first diode to exhibit more stable characteristics.

The first and second diodes may be formed on a silicon-on-insulator (SOI) substrate. The first and second diodes are then surrounded by insulator layers, and therefore formation of superfluous parasitic diodes can be prevented.

According to another aspect of the present invention, there is provided an electrostatic protection circuit comprising:

a first power supply terminal to which a first voltage is applied;

a second power supply terminal to which a second voltage lower than the first voltage is applied;

a signal terminal to which a signal voltage equal to or lower than the first voltage and equal to or higher than the second voltage is applied;

a first diode connected in a forward direction between the first power supply terminal and the signal terminal;

a second diode connected in a forward direction between the signal terminal and the second power supply terminal;

a third diode connected in a reverse direction between the first power supply terminal and the signal terminal; and a fourth diode connected in a reverse direction between the signal terminal and the second power supply terminal, wherein a forward drop voltage of each of the first and second diodes is set to be higher than a drive voltage supplied between the first and second power supply terminals.

According to this aspect of the present invention, one of the first to fourth diodes certainly operates in a forward direction with respect to the static electricity applied between the signal terminals and the first/second power supply terminal regardless of the polarity of the static electricity. Electrostatic charges therefore can be quickly absorbed through the diode in a forward direction.

The first and second diodes are connected in a forward direction between the signal terminal and the first or second power supply terminal. Therefore, the first and second diodes are forward-biased to electric charges of the drive voltage applied between the signal terminal and the first/second power supply terminal in the ordinary operations. However, the forward drop voltage of each of the first and second diodes is set to be higher than the drive voltage supplied between the first and second power supply terminals. For this reason, a forward leakage current does not flow through the first and diode during normal operation.

The above-mentioned features can be applied to other aspects of the present invention.

According to still another aspect of the present invention, there is provided a semiconductor integrated circuit comprising:

a logic circuit formed by interconnecting a plurality of p-type MOS transistors and a plurality of n-type MOS transistors; and an input/output circuit disposed around the logic circuit, wherein the input/output circuit includes an electrostatic protection circuit which protects the logic circuit from static electricity and has elements of one aspect of the present invention.

According to this aspect of the present invention, the logic circuit can be protected from static electricity by the actions of the above-described electrostatic protection circuit.

Above-described features of the electrostatic protection circuit can be applied to the semiconductor integrated circuit of the present invention.

Particularly, the diffusion concentration of at least one of the p-type and n-type diffusion layers of the first diode may be set equal to or higher than the diffusion concentration of diffusion layers used for source electrodes of the plurality of p-type and n-type MOS transistors in the logic circuit. If the diffusion concentrations of the above diffusion layers are set to be equal, no forward leakage current occurs through the second diode during normal operation when the forward drop voltage (contact potential) of the second diode is set to be higher than the drive voltage supplied between the first and second power supply terminals. If the above diffusion concentrations are set to be higher, the contact potential of the second diode increases and higher power supply voltages can be used.

Similarly in the case that the threshold voltage of the MOS transistor which forms the second diode is set to be higher than the threshold voltage of each of the plurality of p-type and n-type MOS transistors in the logic circuit, higher power supply voltages can be used.

The semiconductor integrated circuit according to other aspects of the present invention includes the electrostatic protection circuit having the elements of the other aspects of the present invention.

The above described features of the electrostatic protection circuit can be applied to the semiconductor integrated circuit of the present invention.

BEST MODE FOR CARRYING OUT OF THE INVENTION

Figure 32:
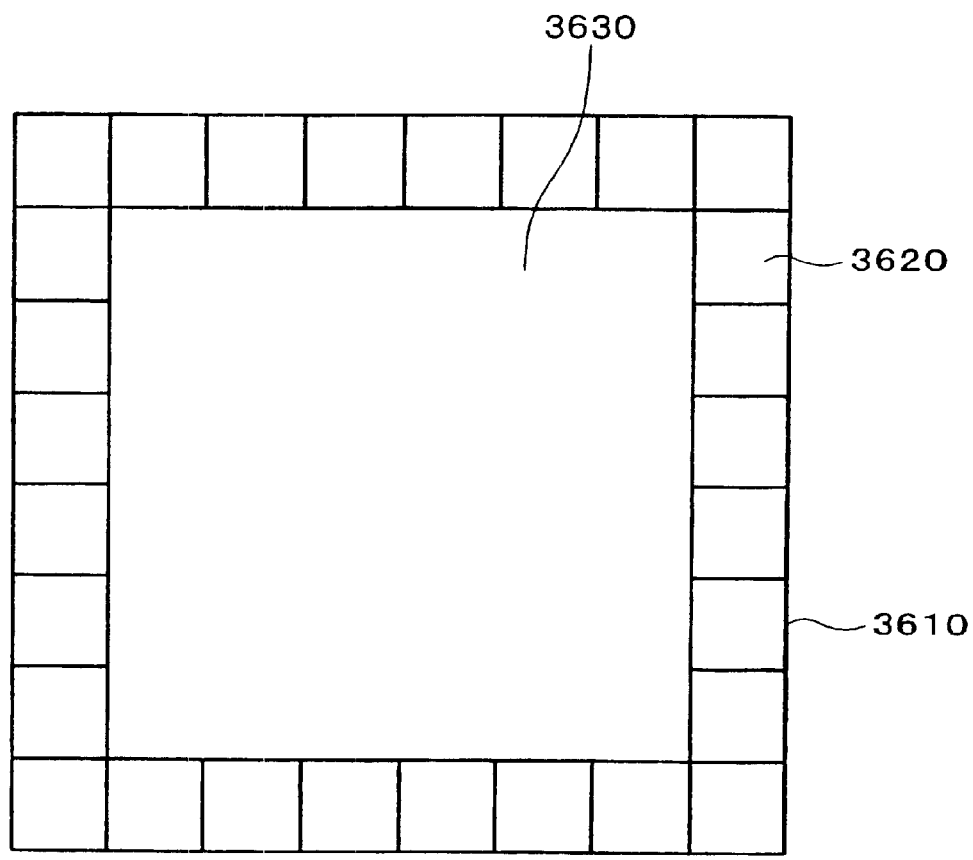
FIG. 32 is a block diagram showing an example of layout of a common semiconductor integrated circuit.

FIG. 32 shows a common configuration of a semiconductor integrated circuit. Basic cells are disposed close together on a chip 3610. In a logic circuit region 3630, a plurality of basic cells are connected to form logic circuits. An input/output region 3620 is arranged around the logic circuit region 3630, and individual input/output circuits are arranged in the input/output region 3620. Though not shown in the drawing, an electrostatic protection circuit is incorporated in each input/output circuit. Further, though not shown, the electrostatic protection circuit can be used not only for the logic circuits as shown in FIG. 32, but also for analog circuits and memory circuits. The present invention is mainly related to the electrostatic protection circuit.

The present invention will be described in more detail below.

First Embodiment

Figure 1:
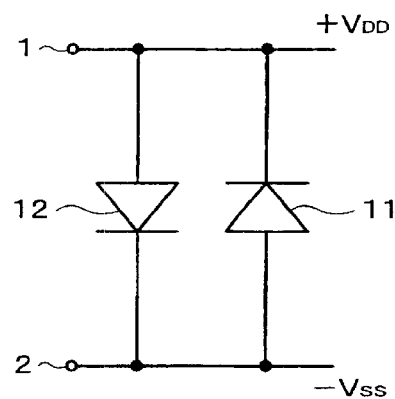
FIG. 1 is a circuit diagram showing a first embodiment of the present invention.

FIG. 1 is a circuit diagram showing a first embodiment of the present invention. In FIG. 1, diodes 11 and 12 are each composed of a p-type diffusion layer and a n-type diffusion layer. A potential $+V_{DD}$ is applied to a first power supply terminal 1 and a potential $-V_{SS}$ is applied to a second power supply 2. Between the first power supply terminal 1 and the second power supply terminal 2, the diode 12 is connected in a forward direction and the diode 11 is connected in a reverse direction. This connection ensures either one of the diodes 11 or 12 to operate in a forward direction to the current regardless of the polarity of electrostatic charges, even if static electricity is applied between the first and second power supply terminals 11 and 12. Therefore, electric charges can be absorbed quickly and the diodes themselves are not easily broken down if acting in a forward direction to the charges, thereby ensuring high electrostatic endurance.

In FIG. 1, there is no problem with the diode 11 because it becomes a reverse-biased diode with respect to the power supply voltage when the integrated circuit is powered to operate, whereas the diode 12 becomes a forward-biased diode with respect to the power supply voltage when the integrated circuit is operating. Accordingly, if the voltage between the first and second power supply terminals is high, a current flows through the forward-biased diode. Therefore, the embodiment shown in FIG. 1 is normally used when the voltage between the first and second power supply terminals is smaller than the contact potential of the forward-biased diode. In the case using the diffusion concentrations of p-type diffusion and n type-diffusion used in MOS integrated circuits, a common contact potential of diodes formed is about from 0.5 to 0.8 V. In recent years, integrated circuits operated on 0.5 V or smaller power supply voltages are increasing to meet demands for a smaller power consumption or for lower voltage operation for portable equipment or for operation using solar batteries as a power supply source. There is a tendency toward even lower voltage power supply as miniaturization of various devices progresses. In some SOI integrated circuits, the dynamic threshold MOS (hereinafter abbreviated as DTMOS) structure is used to lower an equivalent threshold voltage during operation for allowing such circuits to be operated at a lower voltage by connecting the gate electrode of each MOSFET and the body (substrate). In this case, there exists a diode connected in a forward direction between the aforementioned body connected to the gate and the source electrode. SOI integrated circuits using DTMOSs are therefore used on a power supply voltage lower than the contact potential of the diode. The embodiment of the present invention shown in FIG. 1 can be effectively used as an electrostatic protection circuit when the above-described circuit is operated on power supply voltages 0.5 V or less or lower than the contact potential of diodes.

Second Embodiment

Figure 2:
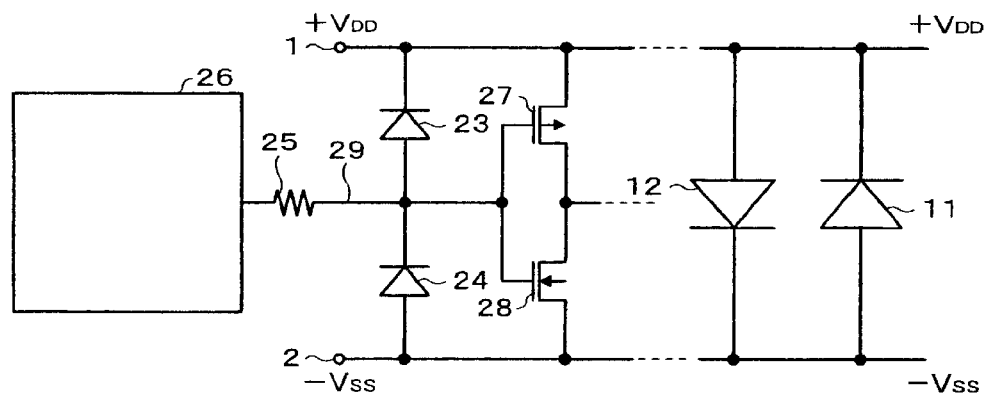
FIG. 2 is a circuit diagram of a second embodiment, providing a more practical configuration of the first embodiment.

A diode forming charge absorbing paths between the first and second power supply terminals 1 and 2 of the electrostatic protection circuit is shown in FIG. 1, whereas FIG. 2 shows a more practical configuration of the electrostatic protection circuit containing a signal terminal 29. In FIG. 2, a pad 26 for exchanging signals with the outside of the integrated circuit and a resistor 25 for buffering the electrical shock when static electricity comes in are shown. Diodes 23 and 24 are for absorbing the charge that comes into a signal terminal 29. A p-type MOSFET 27 and an n-type MOSFET 28 compose an inverter circuit, and the signal terminal 29 is connected to the gates of the input terminal of the inverter circuit. The following four cases are possible paths for the flow of charges between the signal terminal 29 and the first and second power supply terminals 1 and 2:

(A) Signal terminal: positive charges, First power supply terminal: negative charges
(B) Signal terminal: negative charges, First power supply terminal: positive charges
(C) Signal terminal: positive charges, Second power supply terminal: negative charges
(D) Signal terminal: negative charges, Second power supply terminal: positive charges In the cases (A) and (D), the diode 23 or diode 24 operates in a forward direction to the charges. Accordingly, electrostatic charges that come in can be quickly absorbed, whereby electrostatic breakdown can be prevented. In the case (B), negative charges first flow through the diode 24 in a forward direction to the second power supply terminal 2, and then flow from the second power supply terminal 2 to the first power supply terminal 1 through the diode 12 in a forward direction. The charges thus flow all the way in a forward direction, and there is no path on which the charges force their way through in a reverse direction. In case (C), the positive charges applied to the signal terminal 29 first flow through the diode 23 in a forward direction to the first power supply terminal 1, and then flow from the first power supply terminal 1 to the second power supply terminal 2 through the diode 12 in a forward direction. The charges thus flow all the way in a forward direction, and there is no path on which the charges force their way through in a reverse direction. As described above, the addition of the diode 12 between the first and second power supply terminals 1 and 2 provides an absorbing path which is entirely in a forward direction for the static electricity applied to the signal terminal 29, thereby increasing electrostatic endurance.

In the case where static electricity is applied between the first and second power supply terminals, either of the diode 11 or diode 12 certainly operates in a forward direction to the charges, and hence the electrostatic endurance between the first and second power supply terminals is improved.

Third Embodiment

Figure 3:
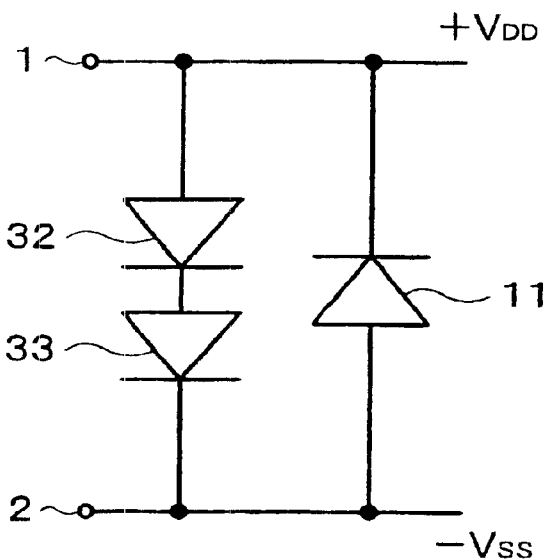
FIG. 3 is a circuit diagram showing a third embodiment of the present invention.

FIG. 3 is a circuit diagram showing a third embodiment of the present invention. In FIG. 3, diodes 11, 32, and 33 are each composed of a p-type diffusion layer and a n-type diffusion layer. A configuration which connects two diodes 32 and 33 in series is used in FIG. 3, as opposed to the circuit shown in FIG. 1 which has only one diode 12. The two diodes can be regarded to be equivalent to a single diode. The configuration doubles the contact potential and causes the diodes to be operated in a forward direction between the first and second power supply terminals 1 and 2 without a forward leakage current even if the voltage between the first and second power supply terminals is high. As described above, the circuit in FIG. 3 has high electrostatic endurance and can be used for a sufficiently high voltage range between the first and second power supply terminals encountered in practical use. Since the diode 11 in FIG. 3 is reverse-biased between the first and second power supply terminals during the normal operation, this may be a single diode as that used in conventional circuit without increasing the contact potential or connecting in series.

Although two diodes 32 and 33 are connected in series in FIG. 3, three or more diodes can be connected in series according to the voltage range between the first and second power supply terminals used.

Fourth Embodiment

Figure 4:
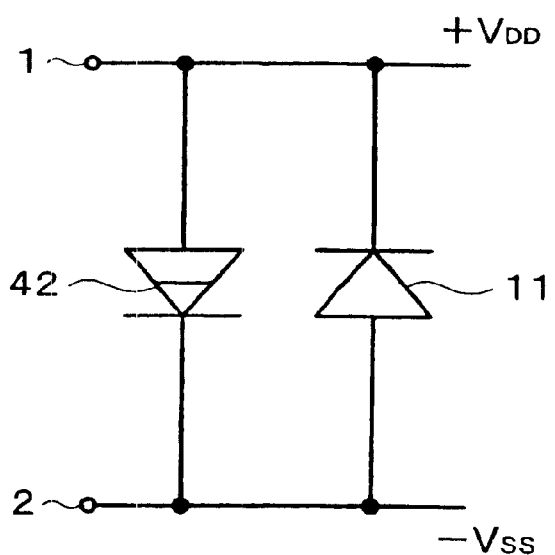
FIG. 4 is a circuit diagram showing a fourth embodiment of the present invention.

FIG. 4 is a circuit diagram showing a fourth embodiment of the present invention. The configuration in FIG. 4 has a diode 42 used in place of the diode 12 in FIG. 1. In the diode 42, the diffusion concentration of either the p-type diffusion layer or n-type diffusion layer or both is changed to increase the contact potential. The contact potential $V_B$ of a diode can be defined as follows:

$$V_B = -(kT/q) \cdot \mathrm{Log}_e\{((n_N \cdot n_p)/n_i^2)\}$$

wherein k is Boltzmann's constant, T is an absolute temperature, q is a magnitude of electronic charge for a single electron, $n_N$ is the impurity concentration of the n-type diffusion layer, $n_p$ is the impurity concentration of the p-type diffusion layer, $n_i$ is the electron density thermally excited and present in the conduction band in single-crystal silicon, and $Log_e$ is the natural logarithm. Therefore, the contact potential can be increased by increasing the diffusion concentrations. The diode 42 in FIG. 4 has a contact potential which is made greater than that of the diode 11 by increasing the diffusion concentration of either the p-type diffusion layer or n-type diffusion layer or both. The diode 42 can thus be used for a higher voltage between the first and second power supply terminals.

Fifth Embodiment

Figure 5:
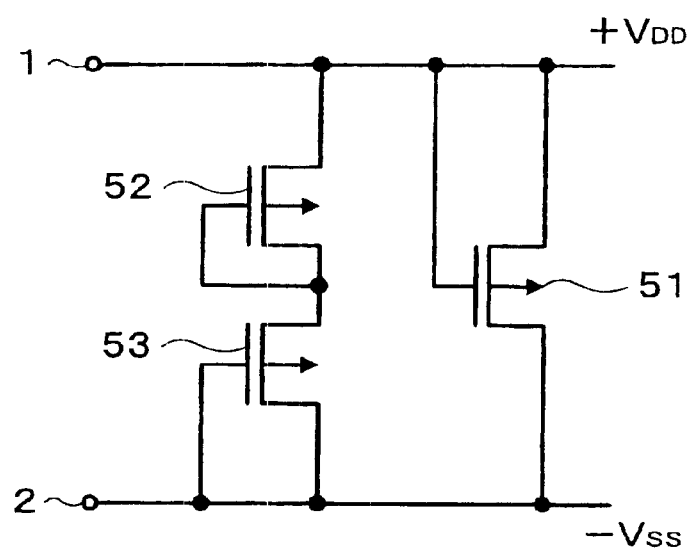
FIG. 5 is a circuit diagram showing a fifth embodiment of the present invention.

FIG. 5 is a circuit diagram showing a fifth embodiment of the present invention. The gate electrode and source electrode of a p-type MOSFET 51 are connected to the first power supply terminal 1, and the drain electrode is connected to the second power supply terminal 2. The source electrode of a p-type MOSFET 52 is connected to the first power supply terminal 1, and the gate electrode and drain electrode are connected to the source electrode of a p-type MOSFET 53. The gate electrode and drain electrode of the p-type MOSFET 53 are connected to the second power supply terminal 2.

As described above, the gate electrode and source electrode of the p-type MOSFET 51 are connected to the first power supply terminal 1 and the drain electrode is connected to the second power supply terminal 2. Therefore, if the potential of the second power supply terminal 2 is higher than the first power supply terminal 1 and the voltage difference is greater than the threshold voltage of the p-type MOSFET 51, the p-type MOSFET 51 turns on. If the potential of the second power supply terminal 2 is lower than the first power supply terminal 1, the p-type MOSFET 51 turns off. Specifically, the p-type MOSFET 51, with the source electrode and gate electrode being connected together, exhibits diode characteristics and performs the same function as the diode 11 in FIG. 3. The threshold voltage of the p-type MOSFET 51 corresponds to the contact potential of the diode. Similarly, the p-type MOSFETs 52 and 53, each with the gate electrode and drain electrode being connected together, also show diode characteristics and perform the same function as the two diodes 32 and 33 connected in series as shown in FIG. 3. The p-type MOSFETs 52 and 53 therefore operate in a forward direction with respect to static electricity of the same polarity as that of the power supply and perform the function of absorbing electric charges. Moreover, since two MOSFETs 52 and 53 are connected in series, a forward leak current does not flow even if the voltage between the first and second power supply terminals is increased to the sum of the threshold voltages of individual p-type MOSFETs 52 and 53.

Three or more MOSFETs may be connected in series to cause the semiconductor device to operate on even higher voltages between the first and second electric terminals.

Sixth Embodiment

Figure 6:
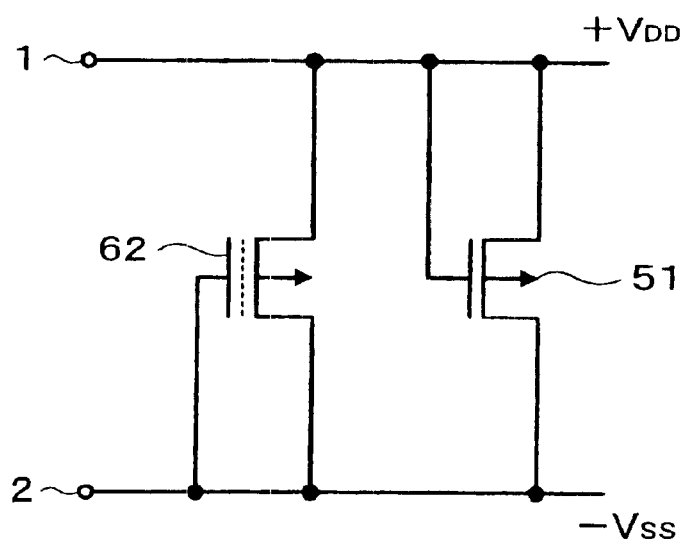
FIG. 6 is a circuit diagram showing a sixth embodiment of the present invention.

FIG. 6 is a circuit diagram showing a sixth embodiment of the present invention. In FIG. 6, the two series-connected p-type MOSFETs 52 and 53 in FIG. 5 are replaced by a p-type MOSFET 62. Specifically, the p-type MOSFET 62 in FIG. 6, with the gate electrode and drain electrode connected together, exhibits diode characteristics and performs the same function as the diode 12 in FIG. 1. The p-type MOSFET 62 is designed to have a threshold voltage greater than those of the p-type MOSFET 51 or common p-type MOSFETs used in the terminal regions of the internal circuit of integrated circuits. The p-type MOSFET 62 therefore does not turn on at a relatively high voltage between the first and second power supply terminals, making it possible to supply the MOSFETs in the integrated circuit with sufficiently high voltages between the first and second power supply terminals to operate them without a leakage current. There are a variety of methods for increasing the threshold voltage of the p-type MOSFET 62, for example, a method of changing the channel-doping implantation dose, a method of increasing the gate film thickness, a method of changing the gate material, and a method of changing the impurity concentration.

Seventh Embodiment

Figure 7:
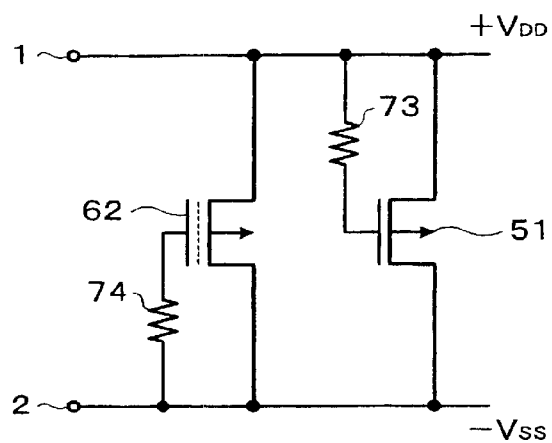
FIG. 7 is a circuit diagram showing a seventh embodiment of the present invention.

FIG. 7 is a circuit diagram showing a seventh embodiment of the present invention. In FIG. 7, a resistor 74 is added to the gate of the p-type MOSFET 62 in FIG. 6, and a resistor 73 is added to the gate of the p-type MOSFET 51 in FIG. 6. This configuration prevents occurrence of electrostatic breakdown of the gates of the p-type MOSFETs 51 and 62, thereby increasing the electrostatic endurance in some cases.

Eighth Embodiment

Figure 8:
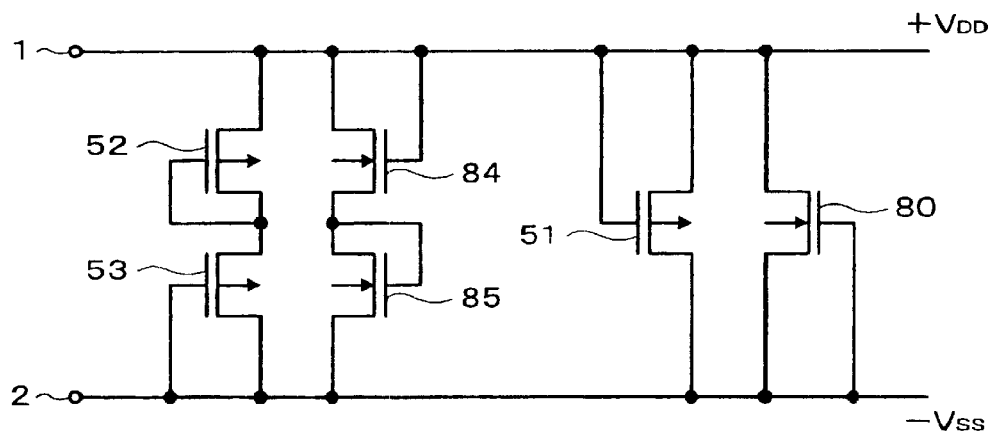
FIG. 8 is a circuit diagram showing an eighth embodiment of the present invention.
Figure 9:
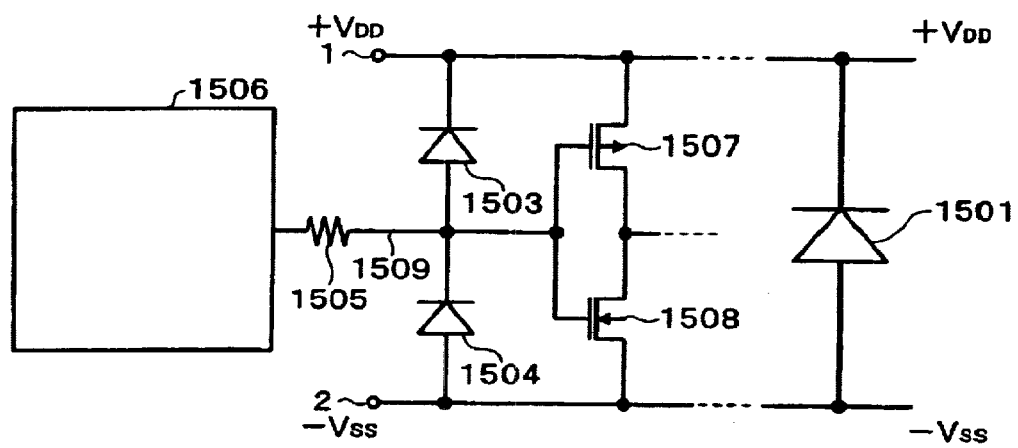
FIG. 9 is a circuit diagram showing a more practical embodiment of a conventional electrostatic protection circuit.
Figure 10:
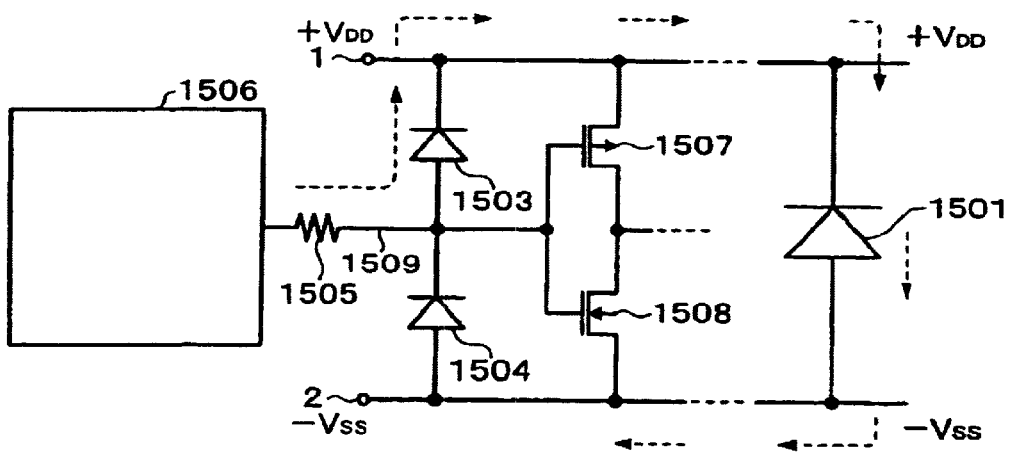
FIG. 10 is a schematic diagram showing an example of a flow of charges in the case where static electricity is applied to a conventional electrostatic protection circuit.
Figure 11:
FIG. 11 is a circuit diagram showing an example of a conventional electrostatic protection circuit.
Figure 12:
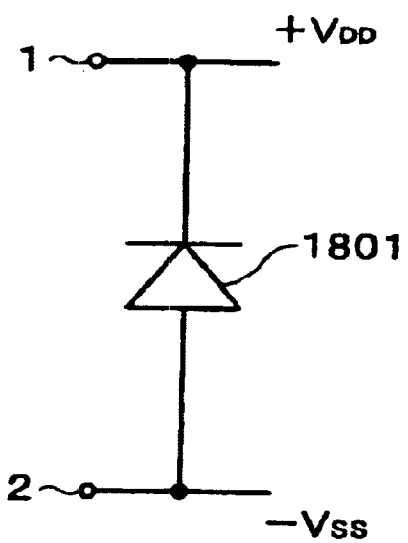
FIG. 12 is a circuit diagram showing another example of a conventional electrostatic protection circuit.
Figure 13:
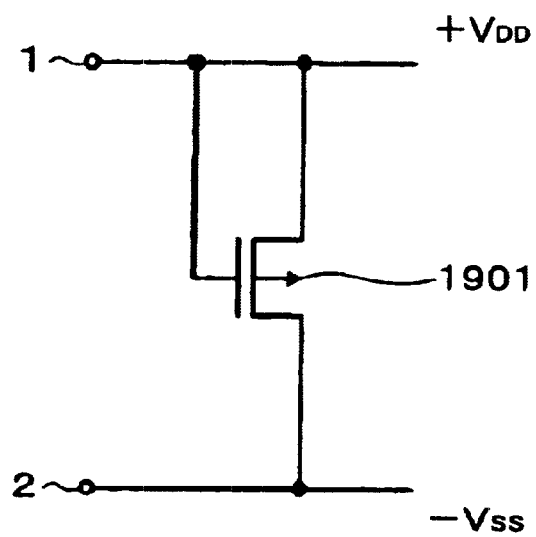
FIG. 13 is a circuit diagram showing still another example of a conventional electrostatic protection circuit.
Figure 14:
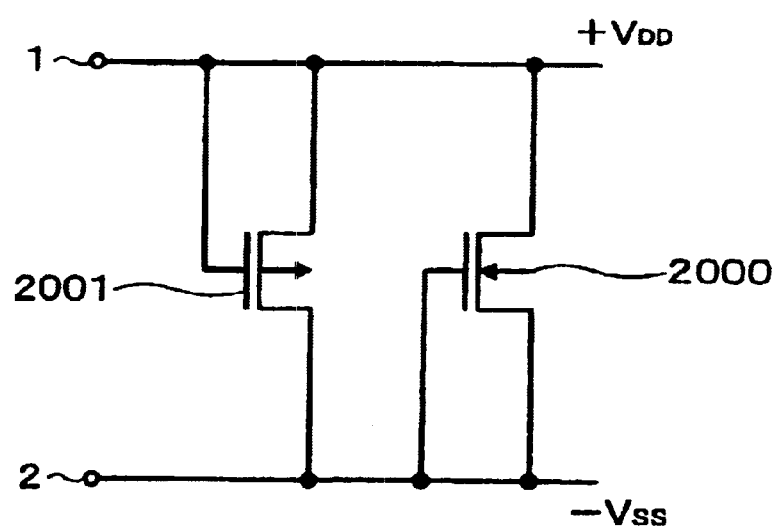
FIG. 14 is a circuit diagram showing still another example of a conventional electrostatic protection circuit.

FIG. 8 is a circuit diagram showing an eighth embodiment of the present invention. In FIG. 8, an n-type MOSFET 80 and two series-connected n-type MOSFETs 84 and 85 are connected in parallel between the first and second power supply terminals of the circuit shown in FIG. 5. The n-type MOSFET 80 is connected so as to perform the same function as the p-type MOSFET 51. The n-type MOSFETs 84 and 85 are connected so as to perform the same function as the p-type MOSFETs 52 and 53. In other words, FIG. 8 forms the same circuit configuration as in FIG. 5 using both the p-type MOSFETs and n-type MOSFETs. Since both p-type and n-type MOSFETs are used, stable characteristics can be expected.

Ninth Embodiment

Figure 15:
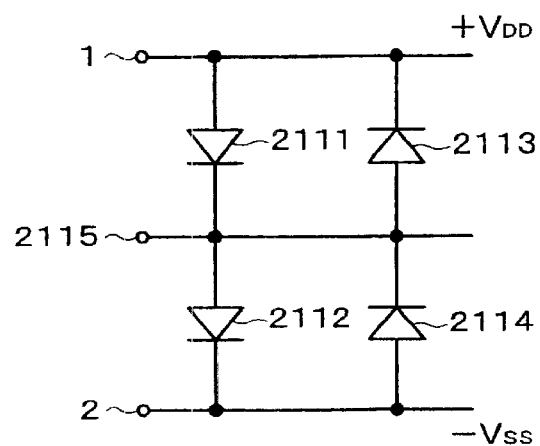
FIG. 15 is a circuit diagram showing a ninth embodiment of the present invention.

FIG. 15 is a circuit diagram showing a ninth embodiment of the present invention. A potential $+V_{DD}$ is applied to a first power supply terminal 1 and a potential $-V_{SS}$ is applied to a second power supply 2. Between the first and second power supply terminals, diodes 2111 and 2112 are connected in series in a forward direction. Between the first and second power supply terminals, diodes 2113 and 2114 are connected in series in a reverse direction. For static electricity applied between a signal terminal 2115 and first and second power supply terminals, one of the four diodes 2111, 2112, 2113, and 2114 certainly operates in a forward direction to the charges of both positive and negative polarities. Therefore, electric charges can be absorbed quickly and the diodes themselves are not easily broken down if acting in a forward direction to the charges, thereby ensuring high electrostatic endurance.

Tenth Embodiment

Figure 16:
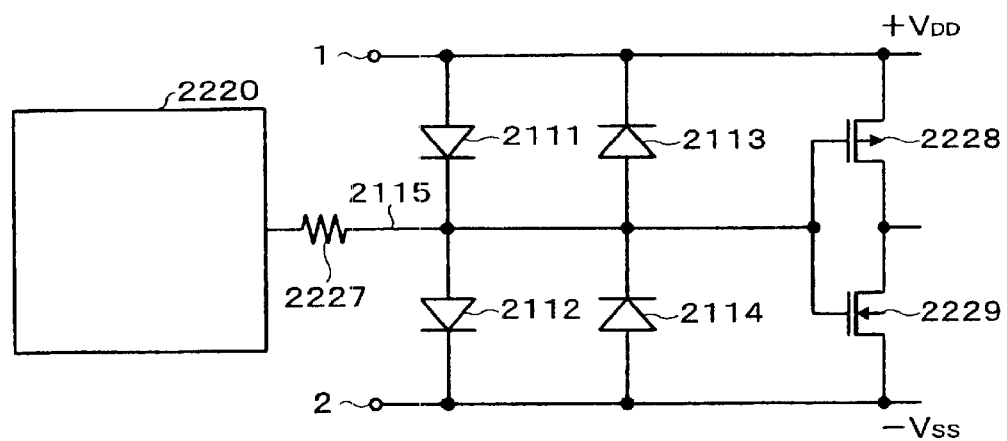
FIG. 16 is a circuit diagram showing a more practical configuration of a tenth embodiment of the present invention.

FIG. 16 is a circuit diagram showing a tenth embodiment of the present invention. A diode forming charge absorbing paths between power supply terminals of an electrostatic protection circuit is shown in FIG. 15, whereas FIG. 16 shows a more practical configuration of the electrostatic protection circuit containing a signal terminal. In FIG. 16, a pad 2220 for exchanging signals with the outside of the integrated circuit and a resistor 2227 for buffering the electrical shock when static electricity comes in are shown. A p-type MOSFET 2228 and an n-type MOSFET 2229 form an inverter circuit. Diodes 2111, 2112, 2113, and 2214 perform the function of absorbing electric charges coming from the pad 2220. The gates of the p-type MOSFET 2228 and n-type MOSFET 2229 are protected by this configuration. Although the resistor 2227 is shown in FIG. 16, the resistor 2227 may be omitted in the case of regarding the electric characteristics of input signals as important. Moreover, though an input circuit connected to the gate electrodes of an inverter circuit is shown as an example in FIG. 16, this electrostatic protection circuit can also be applied to an output circuit connected to the drain electrodes of MOSFETs. The following four cases are possible for the flow of charge between the signal terminal 2115 and the first power supply terminal 1 and second power supply terminal 2:

(A) Signal terminal: positive charges, First power supply terminal: negative charges (B) Signal terminal: negative charges, First power supply terminal: positive charges (C) Signal terminal: positive charges, Second power supply terminal: negative charges (D) Signal terminal: negative charges, Second power supply terminal: positive charges In case (A), the diode 2113 operates in a forward direction. In case (B), the diode 2111 operates in a forward direction. In case (C), the diode 2112 operates in a forward direction. In case (D), the diode 2114 operates in a forward direction. Since one of the diodes 2111 to 2114 thus operates in a forward direction in the cases (A) to (D) in this manner, this circuit can absorb incoming electrostatic charge quickly and electrostatic destruction can be prevented.

Eleventh Embodiment

Figure 17:
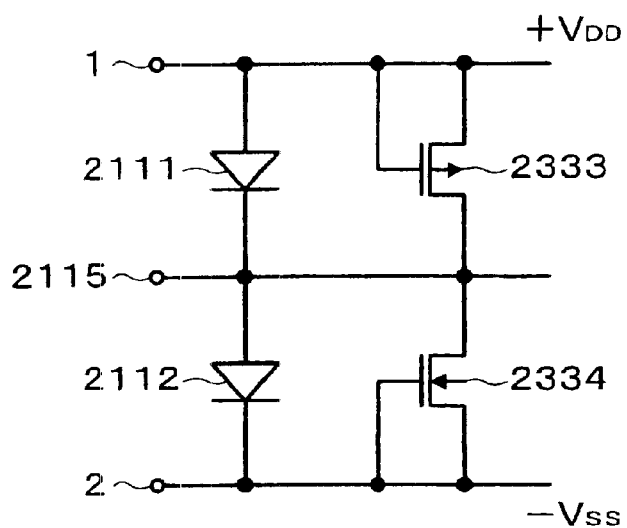
FIG. 17 is a circuit diagram showing an eleventh embodiment of the present invention.

FIG. 17 is a circuit diagram showing an eleventh embodiment of the present invention. The configuration in FIG. 17 has a p-type MOSFET 2333 used in place of the diode 2113 in FIG. 15 and an n-type MOSFET 2334 used in place of the diode 2114 in FIG. 15. The gate electrode and source electrode of the p-type MOSFET 2333 are connected to the first power supply terminal 1, and the drain electrode is connected to the signal terminal 2115. Therefore, when the signal terminal 2115 is at a higher potential than the first power supply terminal 1, the p-type MOSFET 2333 turns on. When the signal terminal 2115 is at a lower potential than the first power supply terminal 1, the p-type MOSFET 2333 turns off. Specifically, the p-type MOSFET 2333 performs the same function as the diode 2113 in FIG. 15. On the other hand, the gate electrode and source electrode of the n-type MOSFET 2334 are connected to the second power supply terminal 2, and the drain electrode is connected to the signal terminal 2115. Therefore, when the signal terminal 2115 is at a lower potential than the second power supply terminal 2, the n-type MOSFET 2334 turns on. When the signal terminal 2115 is at a higher potential than the second power supply terminal 2, the n-type MOSFET 2334 turns off. Specifically, the n-type MOSFET 2333 performs the same function as the diode 2114 in FIG. 15. The electrostatic protection circuit as a charge-absorbing circuit in FIG. 17 therefore performs the same function as the circuit shown in FIG. 15, and provides a high electrostatic endurance. Moreover, the electrostatic protection circuit is suitable for used as a circuit for high-frequency signal terminals. However, in the same manner as in the circuits shown in FIGS. 15 and 16, integrated circuits with this electrostatic protection incorporated must be used on voltages between the first and second power supply terminals lower than the contact potentials of the diodes 2111 and 2113.

Twelfth Embodiment

Figure 18:
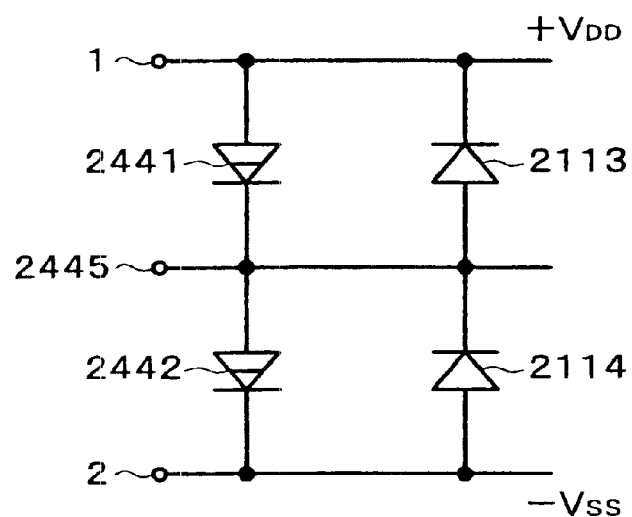
FIG. 18 is a circuit diagram showing a twelfth embodiment of the present invention.

FIG. 18 is a circuit diagram showing a twelfth embodiment of the present invention. This circuit has a diode 2441 in FIG. 18 used in place of the diode 2111 in FIG. 15 and a diode 2442 in FIG. 18 used in place of the diode 2112 in FIG. 15. The diffusion concentration of either the p-type diffusion layer or n-type diffusion layer or both of the diodes 2441 and 2442 is changed to increase the contact potential. As a result, integrated circuits with this circuit incorporated can be used on higher voltages between the first and second power supply terminals.

Thirteenth Embodiment

Figure 19:
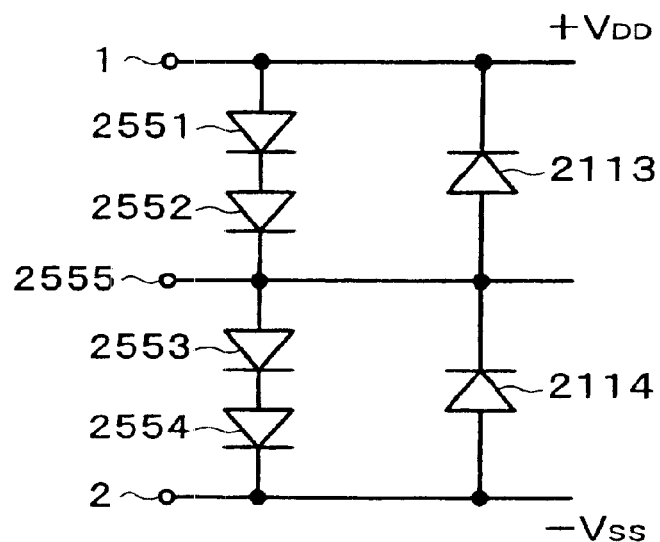
FIG. 19 is a circuit diagram showing a thirteenth embodiment of the present invention.

FIG. 19 is a circuit diagram showing a thirteenth embodiment of the present invention. The diode 2111 in FIG. 15 is replaced with two diodes 2551 and 2552 connected in series in FIG. 18, and the diode 2112 in FIG. 15 is replaced with two diodes 2553 and 2554 connected in series in FIG. 18. In FIG. 19, the two diodes 2551 and 2552 and the two diodes 2553 and 2554 respectively form diodes equivalent to a single diode by being connected in series. This configuration doubles the contact potential and causes the diodes to be operated without a forward leakage current even if the voltage between the first and second power supply terminals is high. As a result, this circuit can provide a high electrostatic endurance, is suited for high-frequency terminals due to a small parasitic electrostatic capacity, and is usable for a practically sufficiently high voltage range between the first and second power supply terminals. On the other hand, the diodes 2113 and 2114 in FIG. 19 are connected in a reverse direction between the first and second power supply terminals. They therefore operate in a reverse direction to the charges during normal operation, eliminating the need for a large contact potential or series connection. A conventional single diode is sufficient to be thus used.

Although two diodes 2551 and 2552 are connected in series, for example, between the first power supply terminal 1 and the signal terminal 2555 in FIG. 19, three or more diodes can be connected in series according to the voltage range between the first and second power supply terminals used.

Moreover, p-type MOSFETs or n-type MOSFETs can also be used in place of pn-junction diodes in the ninth to thirteenth embodiments. For example, the diodes connected in a forward direction between the first and second power supply terminals and the signal terminal can be replaced by p-type MOSFETs 51 shown in FIG. 5.

(Diode Structures)

Figure 27:
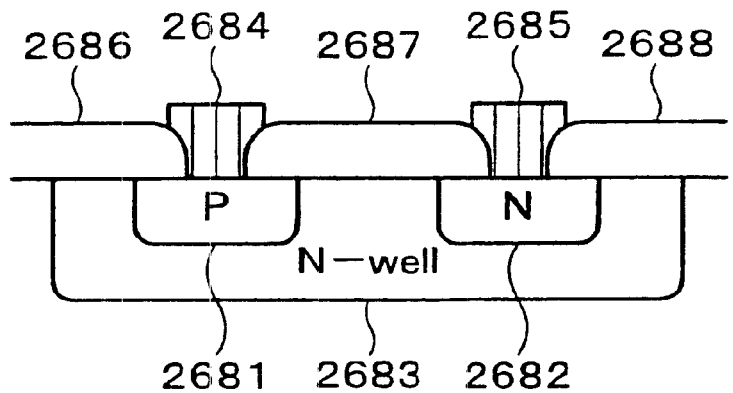
FIG. 27 is a cross-sectional view of still another example of a pn diode used in the present invention.
Figure 28:
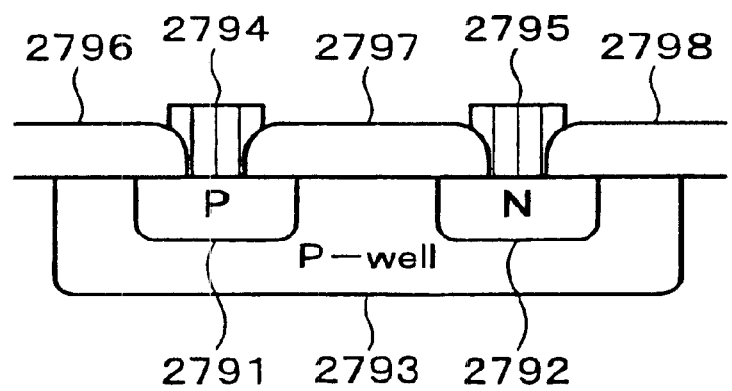
FIG. 28 is a cross-sectional view of still another example of a pn diode used in the present invention.
Figure 29:
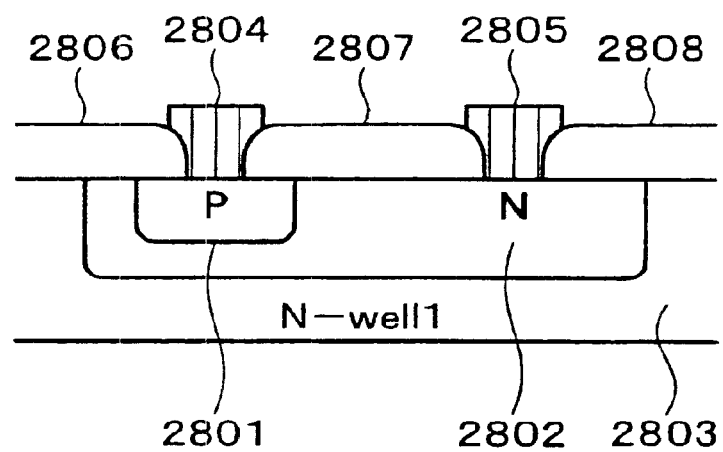
FIG. 29 is a cross-sectional view of still another example of a pn diode used in the present invention.
Figure 30:
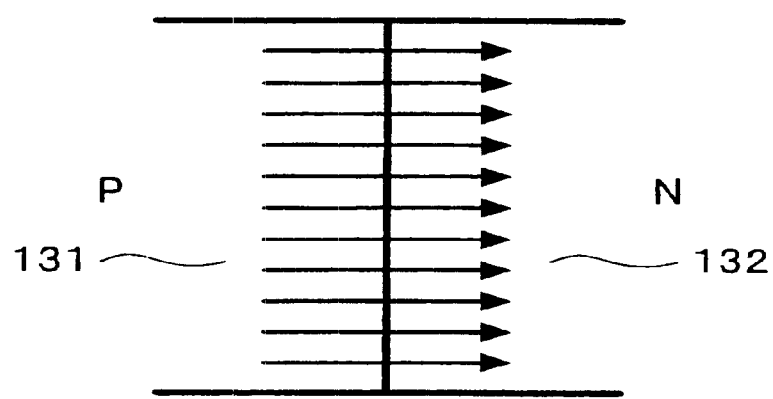
FIG. 30 is a schematic diagram which shows current flowing through the junction of a pn diode used in the present invention in a forward direction.
Figure 31:
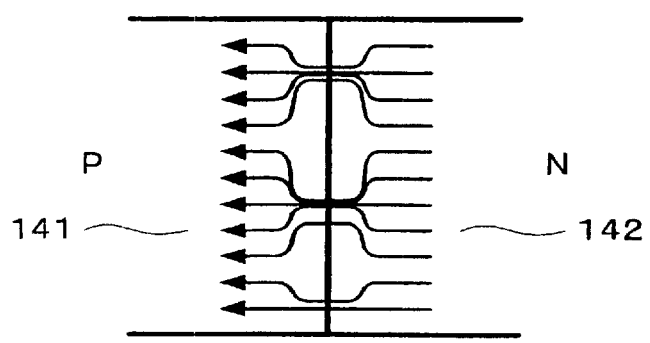
FIG. 31 is a schematic diagram which shows current flowing through the junction of a pn diode used in the present invention in a reverse direction.

So far the present invention has been described from the viewpoint of circuits. Next, examples of the structures of the diodes formed on a silicone substrate or SOI substrate for the first to thirteenth embodiments will be described below referring to FIGS. 20 to 29. FIGS. 20 to 26 show the structures of the diodes formed on an SOI substrate. FIGS. 27 to 29 show the structures of the diodes formed on a silicone substrate.

Figure 20:
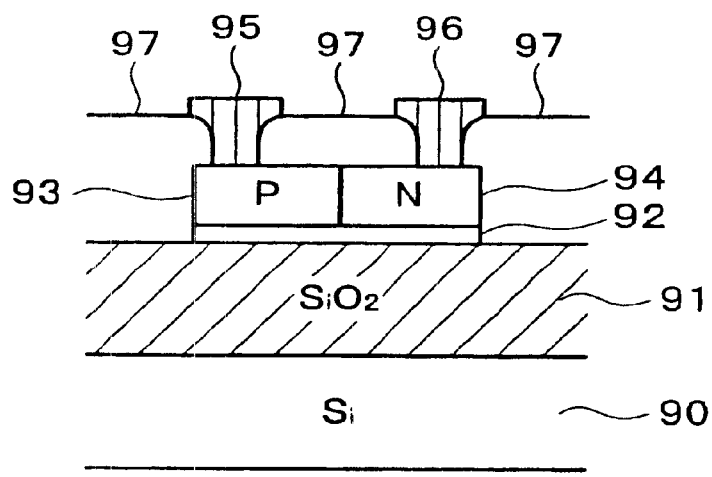
FIG. 20 is a cross-sectional view of an example of a pn diode used in the present invention.

FIG. 20 is a cross-sectional view of a device for composing a diode from a p-type diffusion layer and an n-type diffusion layer. The structure in FIG. 20 has a silicone substrate 90, a buried oxide film layer of silicon dioxide 91, a low-concentration p-type diffusion layer 92, a p-type diffusion layer 93, an n-type diffusion layer 94, aluminum interconnects 95 and 96, and a silicon dioxide insulator film 97. A pn junction of the p-type diffusion layer 93 and the n-type diffusion layer 94 is formed on the low-concentration p-type diffusion layer 92. Though described for the case where the diffusion layers are connected by the aluminum interconnects 95 and 96, other metals such as copper or a low-concentration n-type diffusion layer 92 may also be used. Other substances may be added to the silicon dioxide film 97 as required. In any case, a diode can be formed according to the structure shown in FIG. 20.

Figure 21:
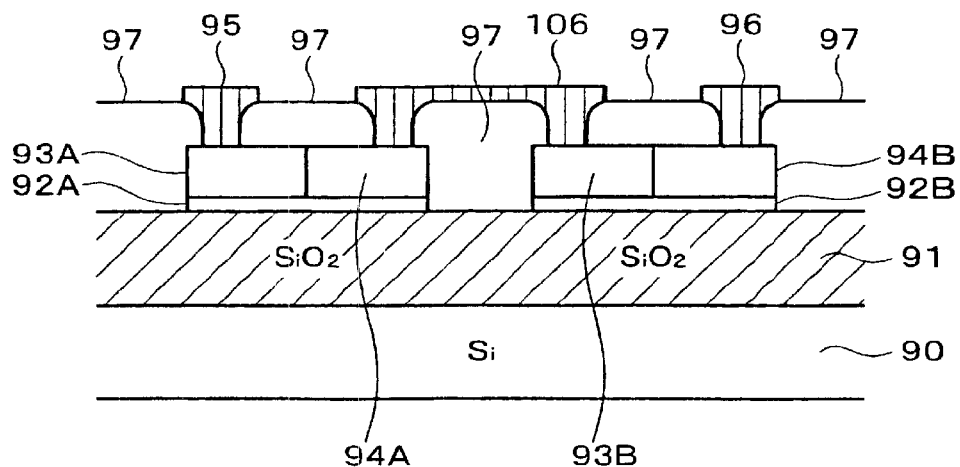
FIG. 21 is a cross-sectional view of another example of a pn diode used in the present invention.

FIG. 21 is a cross-sectional view of a device when connecting the two diodes each shown in FIG. 20 in series. In FIG. 21, the right diode is designated by the same reference numerals as those in FIG. 20 with a subindex A attached, and the left diode is designated by the same reference numerals as those in FIG. 20 with a subindex B attached. The two diodes are connected in series by an aluminum interconnect 106. Since the n-type diffusion layer 94A and the p-type diffusion layer 93B are connected by the aluminum interconnect 106, the pn diode between them can be ignored. The device thus composed of series-connected diodes can be used as the two series-connected diodes 32 and 33 in FIG. 3. Since the SOI substrate used in FIG. 21 has an advantage of covering all areas surrounding the diodes with insulator layers and allowing no parasitic diodes to be formed, only the desired two diodes connected in series can be formed.

Although a structure connecting two diodes in series is shown in FIG. 21, three or more diodes connected in series can be formed using almost the same structure by increasing the number of pn junctions.

Figure 22:
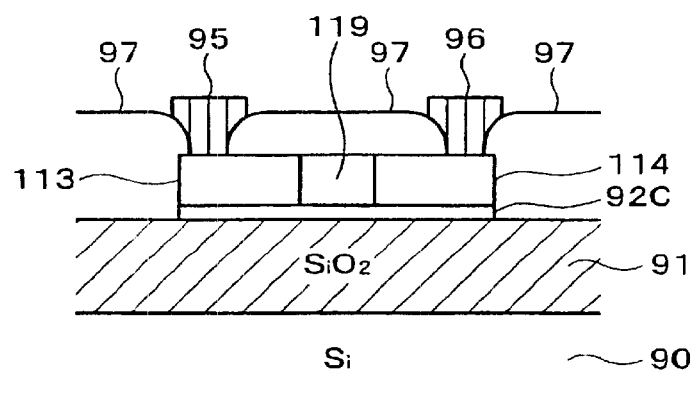
FIG. 22 is a cross-sectional view of still another example of a pn diode used in the present invention.

FIG. 22 is a cross-sectional view of a device of the structure in which a low-concentration p-type diffusion layer 119 is formed between the pn junction of the diode shown in FIG. 20. In FIG. 22, the p-type diffusion layer 113 and n-type diffusion layer 114 forming a diode are provided with a higher diffusion concentration than those in FIG. 20. The reason is to increase the contact potential that constitutes the forward voltage drop of the diode, thereby allowing the integrated circuits to be used on a higher voltage between the first and second power supply terminals. Since a leakage current resulting from tunneling can occur if the high-concentration p-type diffusion layer 113 and n-type diffusion layer 114 are directly joined, the low-concentration p-type diffusion layer 119 that serves as a concentration buffer region is inserted between them.

Figure 23:
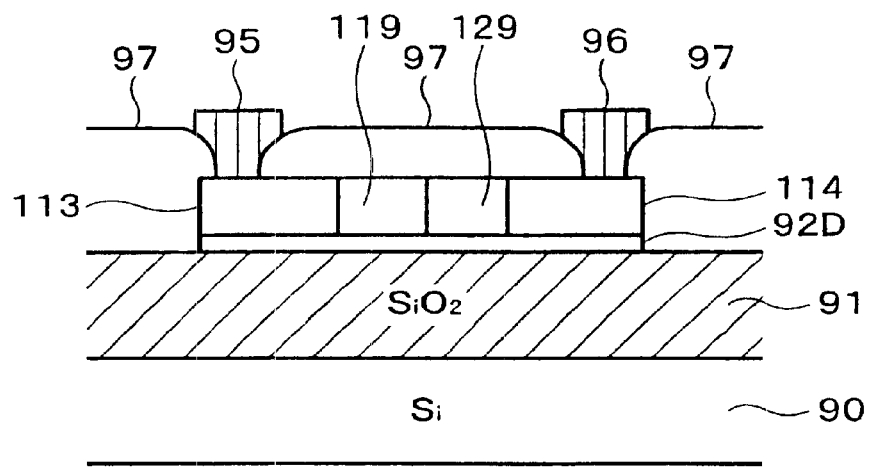
FIG. 23 is a cross-sectional view of still another example of a pn diode used in the present invention.

FIG. 23 is a cross-sectional view of the device in which an additional low-concentration n-type diffusion layer 129 is formed between the pn junction of the diode shown in FIG. 22. If the high-concentration p-type diffusion layer 113 and n-type diffusion layer 114 are directly joined, a leakage current resulting from the tunneling occurs. The difference between FIG. 23 and FIG. 22 resides in that the device shown in FIG. 23 is provided with a low-concentration n-type diffusion layer 129 as the concentration buffer region in addition to the low-concentration p-type diffusion layer 119 in order to improve the effect of preventing occurrence of a leakage current. This structure increases the p and n diffusion concentrations on both sides, and hence increases the contact potential, thereby expanding the voltage range in which the integrated circuits can be used.

Figure 24:
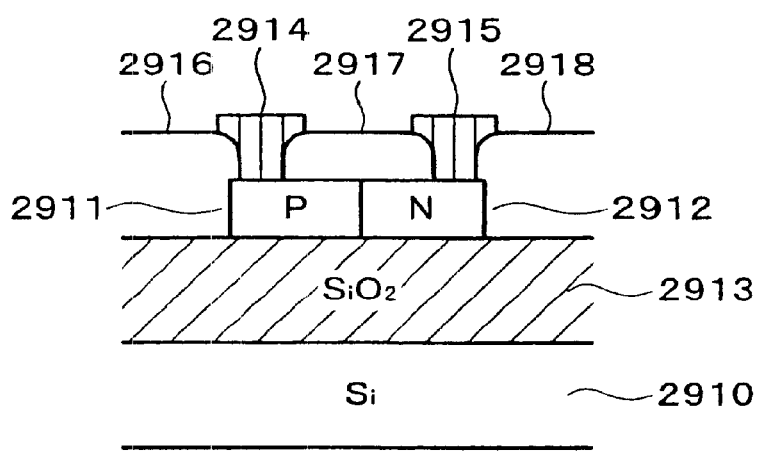
FIG. 24 is a cross-sectional view of still another example of a pn diode used in the present invention.

FIG. 24 is a cross-sectional view of a device for composing a diode from a p-type diffusion layer and an n-type diffusion layer. The structure in FIG. 24 has a p-type diffusion layer 2911, an n-type diffusion layer 2912, a buried oxide film layer of silicon dioxide 2913 unique to an SOI substrate, a silicone substrate 2910, aluminum interconnects 2914 and 2915, and silicon dioxide insulator films 2916, 2917 and 2918. In this structure, a pn diode is formed of the p-type diffusion layer 2911 and n-type diffusion layer 2912 between the terminals of the aluminum interconnects 2914 and 2915. Although the device was described for the case in which the aluminum interconnects 2914 and 2915 are used, other metals such as copper may be used. In addition, the material for insulator film 2913 which is silicon dioxide in this example may be replaced with other insulating material such as sapphire (in which case the substrate is silicon-on-sapphire (SOS)), diamond, or the like. In any case, a diode can also be formed according to the structure of FIG. 24. Since the diode formed on the buried oxide insulator film of SOI as in FIG. 24 is isolated by insulator layers on all sides, formation of parasitic diodes other than desired diodes can be prevented.

Figure 25:
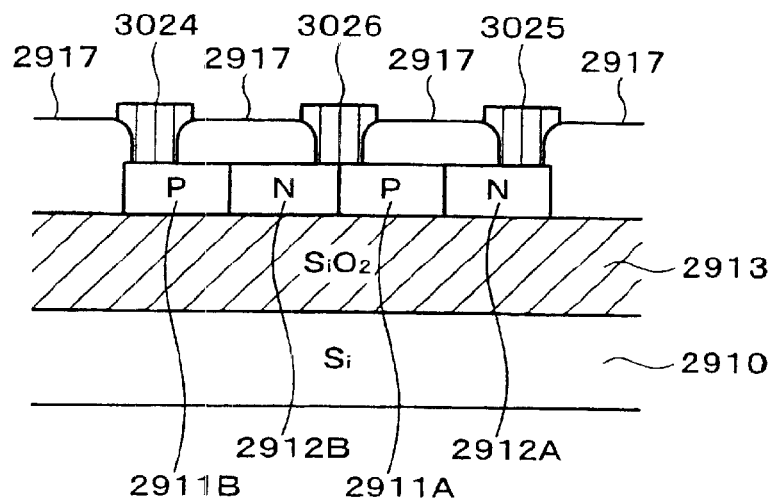
FIG. 25 is a cross-sectional view of still another example of a pn diode used in the present invention.

FIG. 25 is a cross-sectional view of a device in the case of forming two diodes, each composed of a p-type diffusion layer and an n-type diffusion layer connected in series. FIG. 25 is a cross-sectional view of the device in the case of connecting the two diodes in FIG. 24 in series. In FIG. 25, the right diode is designated by the same reference numerals as those in FIG. 24 with a subindex A attached, and the left diode is designated by the same reference numerals as those in FIG. 24 with a subindex B attached. The two diodes are connected in series by an aluminum interconnect 3026. Since the n-type diffusion layer 2912B and the p-type diffusion layer 2911A are connected by the aluminum interconnect 3026, the pn diode between them can be ignored. The device thus composed of series-connected diodes can be used for the two series-connected diodes 2551 and 2552 or two series-connected diodes 2553 and 2554 in FIG. 19. Since the SOI substrate used in FIG. 25 has an advantage of covering all areas surrounding the diodes with insulator layers and allowing no parasitic diodes to be formed, only the desired two diodes connected in series can be formed.

Although a structure connecting two diodes in series is shown in FIG. 25, three or more diodes connected in series can be formed using almost the same structure by increasing the number of p-type and n-type diffusion layers arranged laterally.

Figure 26:
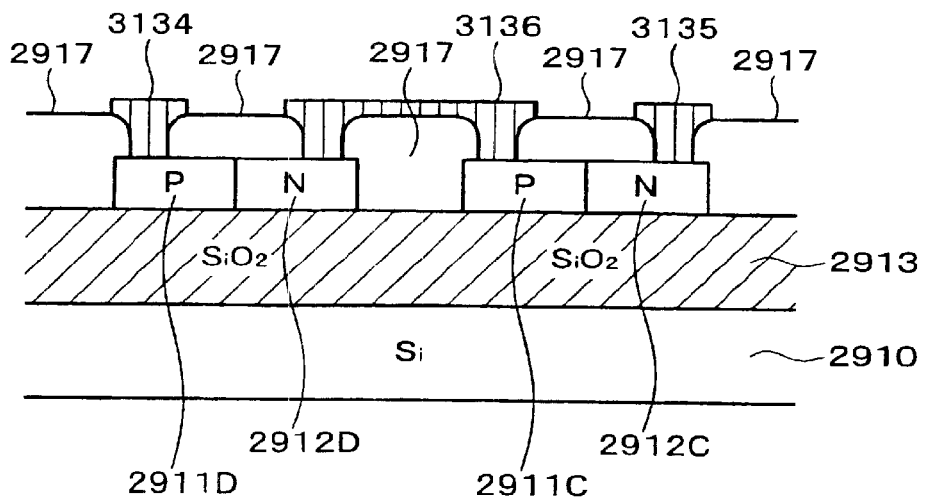
FIG. 26 is a cross-sectional view of still another example of a pn diode used in the present invention.

FIG. 26 is a cross-sectional view of a device in the case of forming two diodes, each composed of a p-type diffusion layer and an n-type diffusion layer connected in series. In FIG. 26, the right diode is designated by the same reference numerals as those in FIG. 24 with a subindex C attached, and the left diode is designated by the same reference numerals as those in FIG. 24 with a subindex D attached. In this structure, two pn diodes are composed of the p-type diffusion layer 2911D and n-type diffusion layer 2912D and the p-type diffusion layer 2911C and n-type diffusion layer 2912C in series between the terminals of the aluminum interconnects 3134 and 3135. Since the n-type diffusion layer 2912D and the p-type diffusion layer 2911C are connected by the aluminum interconnect 3136, the pn diode between them can be ignored from the viewpoint of circuit. The device thus composed of series-connected diodes can be used for the two series-connected diodes 2551 and 2552 or two series-connected diodes 2553 and 2554 in FIG. 19. Since the SOI substrate used in FIG. 26 covers all areas surrounding the diodes with insulator layers and permits no parasitic diodes to be formed, only the desired two diodes connected in series can be formed.

If an SOI substrate is used, a structure in which three or more diodes are connected in series can be easily formed by combining the diodes formed in FIGS. 24 to 26 and interconnecting them with aluminum interconnects.

The diode structure above is described as an integrated circuit using a silicon-on-insulator (SOI) substrate having a buried oxide film layer. However, since any insulator film can perform the same function, the integrated circuit may use sapphire (substrate in this case is referred to as silicon-on-sapphire (SOS) substrate), diamond, or the like as an insulator layer for the substrate.

FIG. 27 is a cross-sectional view of a device for composing a diode from a p-type diffusion layer and an n-type diffusion layer. The structure in FIG. 27 has a p-type diffusion layer 2681, an n-type diffusion layer 2682, a low-concentration n well 2683, aluminum interconnects 2684 and 2685, and silicon dioxide insulator films 2686, 2687, and 2688. A pn diode is composed of the p-type diffusion layer 2681, n well 2683, and n-type diffusion layer 2682 between the terminals of the aluminum interconnects 2684 and 2685.

Though described for the case in which the aluminum interconnects 2684 and 2685 are used, other metals such as copper may be used. Silicon dioxide insulator films 2686, 2687, and 2688 may have other substances added as necessary. In any case, a diode can be formed by the structure in FIG. 27.

FIG. 28 is a cross-sectional view of a device for composing a diode from a p-type diffusion layer and an n-type diffusion layer. The structure shown in FIG. 28 has a p-type diffusion layer 2791, an n-type diffusion layer 2792, a low-concentration p well 2793, aluminum interconnects 2794 and 2795, and silicon dioxide insulator films 2796, 2797, and 2798. In FIG. 28, a pn diode is composed of the p-type diffusion layer 2791, p well 2793, and n-type diffusion layer 2792 between the terminals of the aluminum interconnects 2794 and 2795. The difference between FIG. 28 and FIG. 27 is that the p well 2793 is used in FIG. 28 in place of the n well 2683 in FIG. 27.

FIG. 29 is a cross-sectional view of a device for composing a diode from a p-type diffusion layer and an n-type diffusion layer. The structure in FIG. 29 has a p-type diffusion layer 2801, an n-type diffusion layer 2802, a low-concentration n well 2803, aluminum interconnects 2804 and 2805, and silicon dioxide insulator films 2806, 2807, and 2808. A pn diode is composed of the p-type diffusion layer 2801 and n-type diffusion layer 2802 between the terminals of the aluminum interconnects 2804 and 2805. In any case, a diode can also be formed according to this structure.

As described above, the electrostatic protection circuit of the present invention can provide SOI integral circuits inherently susceptible to static electricity with a high electrostatic endurance between the power supply terminals and between the signal terminal and one of the power supply terminals without need for large-area well layers.

Moreover, since the electrostatic protection circuit of the present invention cause one or more diodes to absorb electrostatic charge in a forward direction, the circuit requires only a smaller area occupied for forming the diodes in an integrated circuit for providing the same level of electrostatic protection. The electrostatic protection circuit of the present invention thus exhibits the effect of raising the layout efficiency and reducing the cost.

What is claimed is:

1. An electrostatic protection circuit comprising:
a first power supply terminal to which a first voltage is applied;
a second power supply terminal to which a second voltage lower than the first voltage is applied;
a first diode connected in a reverse direction between the first and second power supply terminals; and
a second diode connected in a forward direction between the first and second power supply terminals,
wherein a forward drop voltage of the second diode is set to be higher than a drive voltage supplied between the first and second power supply terminals;
the second diode has a pn junction structure formed by a p-type diffusion layer and an n-type diffusion layer joined together;
the forward drop voltage is defined by a contact potential of the p-type diffusion layer and the n-type diffusion layer; and
the first and second diodes are formed on a silicon-on-insulator (SOI) substrate.

2. An electrostatic protection circuit comprising:
a first power supply terminal to which a first voltage is applied;
a second power supply terminal to which a second voltage lower than the first voltage is applied;
a first diode connected in a reverse direction between the first and second power supply terminals; and
a second diode connected in a forward direction between the first and second power supply terminals,
wherein a forward drop voltage of the second diode is set to be higher than a drive voltage supplied between the first and second power supply terminals;
the second diode is formed by a plurality of diodes connected in series;
each of the plurality of diodes has a pn junction structure formed by a p-type diffusion layer and an n-type diffusion layer joined together; and
the first and second diodes are formed on a silicon-on-insulator (SOI) substrate.

3. An electrostatic protection circuit comprising:
a first power supply terminal to which a first voltage is applied;
a second power supply terminal to which a second voltage lower than the first voltage is applied;
a first diode connected in a reverse direction between the first and second power supply terminals; and
a second diode connected in a forward direction between the first and second power supply terminals,
wherein a forward drop voltage of the second diode is set to be higher than a drive voltage supplied between the first and second power supply terminals;
the second diode includes first p-type and n-type diffusion layers and a second p-type or n-type diffusion layer disposed between and connected to the first p-type and n-type diffusion layers;
the diffusion concentration of the first p-type and n-type diffusion layers is set to be higher than the diffusion concentration of the second p-type or n-type diffusion layer; and
the first and second diodes are formed on a silicon-on-insulator (SOI) substrate.

4. An electrostatic protection circuit comprising:
a first power supply terminal to which a first voltage is applied;
a second power supply terminal to which a second voltage lower than the first voltage is applied;
a signal terminal to which a signal voltage equal to or lower than the first voltage and equal to or higher than the second voltage is applied;
a first diode connected in a forward direction between the first power supply terminal and the signal terminal;
a second diode connected in a forward direction between the signal terminal and the second power supply terminal;
a third diode connected in a reverse direction between the first power supply terminal and the signal terminal; and a fourth diode connected in a reverse direction between the signal terminal and the second power supply terminal, wherein a forward drop voltage of each of the first and second diodes is set to be higher than a drive voltage supplied between the first and second power supply terminals, and a high-frequency signal is input to the signal terminal.

5. The electrostatic protection circuit as defined in claim 4, wherein each of the first and second diodes has a pn junction structure formed by a p-type diffusion layer and an n-type diffusion layer joined together; and wherein the forward drop voltage is defined by a contact potential of the p-type diffusion layer and the n-type diffusion layer.

6. The electrostatic protection circuit as defined in claim 4, wherein each of the first and second diodes is formed by a plurality of diodes connected in series; and wherein each of the plurality of diodes has a pn junction structure formed by a p-type diffusion layer and an n-type diffusion layer joined together.

7. The electrostatic protection circuit as defined in claim 4, wherein the second diode includes first p-type and n-type diffusion layers, and a second p-type or n-type diffusion layer disposed between and connected to the first p-type and n-type diffusion layers; and wherein the diffusion concentration of the first p-type and n-type diffusion layers is set to be higher than the diffusion concentration of the second p-type or n-type diffusion layer.

8. The electrostatic protection circuit as defined in claim 4, wherein each of the first and second diodes is formed by a MOS transistor having a drain electrode and a gate electrode which are connected to each other; and wherein the forward drop voltage is defined by the threshold voltage of the MOS transistor.

9. The electrostatic protection circuit as defined in claim 4, wherein each of the first and second diodes is formed by connecting a plurality of MOS transistors in series; and wherein a drain electrode and a gate electrode are connected to each other in each of the plurality of MOS transistors.

10. The electrostatic protection circuit as defined in claim 4, wherein each of the third and fourth diodes is formed by connecting in parallel a p-type MOS transistor having a source electrode and a gate electrode connected to the first power supply terminal, with an n-type MOS transistor having a source electrode and a gate electrode connected to the second power supply terminal.

11. The electrostatic protection circuit as defined in claim 4, wherein the first to fourth diodes are formed on a silicon-on-insulator (SOI) substrate.

* * * * *